US011793096B2

(12) United States Patent
Slovin et al.

(10) Patent No.: US 11,793,096 B2
(45) Date of Patent: Oct. 17, 2023

(54) DISCRETE AND MONOLITHIC PHASE-CHANGE MATERIAL (PCM) RADIO FREQUENCY (RF) SWITCHES WITH SHEET OF THERMALLY CONDUCTIVE AND ELECTRICALLY INSULATING MATERIAL

(71) Applicant: Newport Fab, LLC, Newport Beach, CA (US)

(72) Inventors: Gregory P. Slovin, Irvine, CA (US); Nabil El-Hinnawy, Irvine, CA (US); Jefferson E. Rose, Hawthorne, CA (US); David J Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 388 days.

(21) Appl. No.: 17/148,413

(22) Filed: Jan. 13, 2021

(65) Prior Publication Data

US 2021/0135100 A1     May 6, 2021

Related U.S. Application Data

(63) Continuation-in-part of application No. 16/247,156, filed on Jan. 14, 2019, now Pat. No. 11,050,022, which is a continuation-in-part of application No. 16/173,340, filed on Oct. 29, 2018, now Pat. No. 10,916,540, and a continuation-in-part of application No. 16/103,646, filed on Aug. 14, 2018, now Pat. No. 10,475,993, and a continuation-in-part of application No. 16/103,587, filed on Aug. 14, 2018, now Pat. No.

(Continued)

(51) Int. Cl.
    *H10N 70/00*     (2023.01)
    *H10N 70/20*     (2023.01)

(52) U.S. Cl.
    CPC ......... *H10N 70/861* (2023.02); *H10N 70/231* (2023.02); *H10N 70/841* (2023.02); *H10N 70/882* (2023.02)

(58) Field of Classification Search
CPC .. H10N 70/861; H10N 70/231; H10N 70/841; H10N 70/882
See application file for complete search history.

(56) References Cited

U.S. PATENT DOCUMENTS 7,761,067 B1   7/2010   Tsai et al.
8,614,472 B1   12/2013   Islam et al.
(Continued)

OTHER PUBLICATIONS

"Phase-change RF switches with Robust Switching Cycle Endurance" by Moon et al. (IEEE 2018).
(Continued)

*Primary Examiner* — Michael Jung
(74) *Attorney, Agent, or Firm* — Farjami & Farjami LLP (57) ABSTRACT

A radio frequency (RF) device includes a phase-change material (PCM) situated over a sheet of thermally conductive and electrically insulating material, a heating element situated under the sheet of thermally conductive and electrically insulating material, and an input/output terminal situated over the PCM. The heating element is situated in a dielectric. A heat spreader is situated under the dielectric and over a substrate. Metal interconnect layers can be situated under and/or over the PCM, with the substrate situated below the metal interconnect layers.

20 Claims, 6 Drawing Sheets

Related U.S. Application Data 10,461,253, and a continuation-in-part of application No. 16/103,490, filed on Aug. 14, 2018, now Pat. No. 10,476,001.

(56) References Cited

U.S. PATENT DOCUMENTS

| | | |
|---|---|---|
| 9,368,720 B1 | 6/2016 | Moon et al. |
| 2004/0113232 A1 | 6/2004 | Johnson et al. |
| 2005/0212090 A1 | 9/2005 | Friedrich et al. |
| 2007/0099405 A1 | 5/2007 | Oliva et al. |
| 2008/0042243 A1 | 2/2008 | Lee et al. |
| 2009/0115052 A1 | 5/2009 | Treece et al. |
| 2010/0238603 A1 | 9/2010 | Chung |
| 2015/0022938 A1 | 1/2015 | Okada et al. |
| 2015/0104921 A1 | 4/2015 | Terai et al. |
| 2016/0300612 A1 | 10/2016 | Manipatruni et al. |
| 2017/0365427 A1* | 12/2017 | Borodulin .......... H10N 70/8613 |
| 2019/0165265 A1* | 5/2019 | Yen .................... H10N 70/884 |

OTHER PUBLICATIONS

"Highly Reconfigurable Aluminum Nitride MEMS Resonator Using 12 Monolithically Integrated Phase Change Material Switches" by Hummel et al. (IEEE 2015).

"Switchable Aluminum Nitride MEMS Resonator Using Phase Change Materials" by Hummel et al. (TRF 2014).

* cited by examiner

DISCRETE AND MONOLITHIC PHASE-CHANGE MATERIAL (PCM) RADIO FREQUENCY (RF) SWITCHES WITH SHEET OF THERMALLY CONDUCTIVE AND ELECTRICALLY INSULATING MATERIAL

CLAIMS OF PRIORITY

The present application is a continuation-in-part of and claims the benefit of and priority to application Ser. No. 16/247,156 filed on Jan. 14, 2019, titled "Heat Management for Increased Manufacturability and Performance of Phase-Change Material (PCM) Radio Frequency (RF) Switches". Application Ser. No. 16/247,156 is in turn a continuation-in-part of and claims the benefit of and priority to application Ser. No. 16/103,490 filed on Aug. 14, 2018, titled "Manufacturing RF Switch Based on Phase-Change Material," now U.S. Pat. No. 10,476,001. application Ser. No. 16/247,156 is also a continuation-in-part of and claims the benefit of and priority to application Ser. No. 16/103,587 filed on Aug. 14, 2018, titled "Design for High Reliability RF Switch Based on Phase-Change Material," now U.S. Pat. No. 10,461,253. application Ser. No. 16/247,156 is also a continuation-in-part of and claims the benefit of and priority to application Ser. No. 16/103,646 filed on Aug. 14, 2018, titled "PCM RF Switch Fabrication with Subtractively Formed Heater," now U.S. Pat. No. 10,475,993. application Ser. No. 16/247,156 is further a continuation-in-part of and claims the benefit of and priority to application Ser. No. 16/173,340 filed on Oct. 29, 2018, titled "Device Including PCM RF Switch Integrated with Group III-V Semiconductors". The disclosures and contents of all of the above-identified applications are hereby incorporated fully by reference into the present application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

In order to rapidly cool down phase-change materials, heat must be dissipated from a PCM RF switch by using heat spreading techniques. However, heat spreaders may pose manufacturing cost and device design challenges. Further, heat spreaders may result in increased RF noise coupling with interconnect metallizations and integrated devices. Techniques for reducing RF noise coupling applicable to conventional semiconductor devices may not be suitable for PCM RF switches. Various modifications in structure can adversely impact thermal energy management and may also decrease the reliability of PCM RF switches. Accordingly, integrating PCM RF switches with interconnect metallizations and other devices can present significant challenges. Specialty manufacturing is often impractical, and large scale manufacturing generally trades practicality for the ability to control device characteristics.

Thus, there is a need in the art for semiconductor devices with improved heat dissipation for PCM RF switches and reduced RF noise coupling when PCM RF switches are integrated with interconnect metallizations and other devices.

SUMMARY

The present disclosure is directed to discrete and monolithic phase-change material (PCM) radio frequency (RF) switches with sheet of thermally conductive and electrically insulating material, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
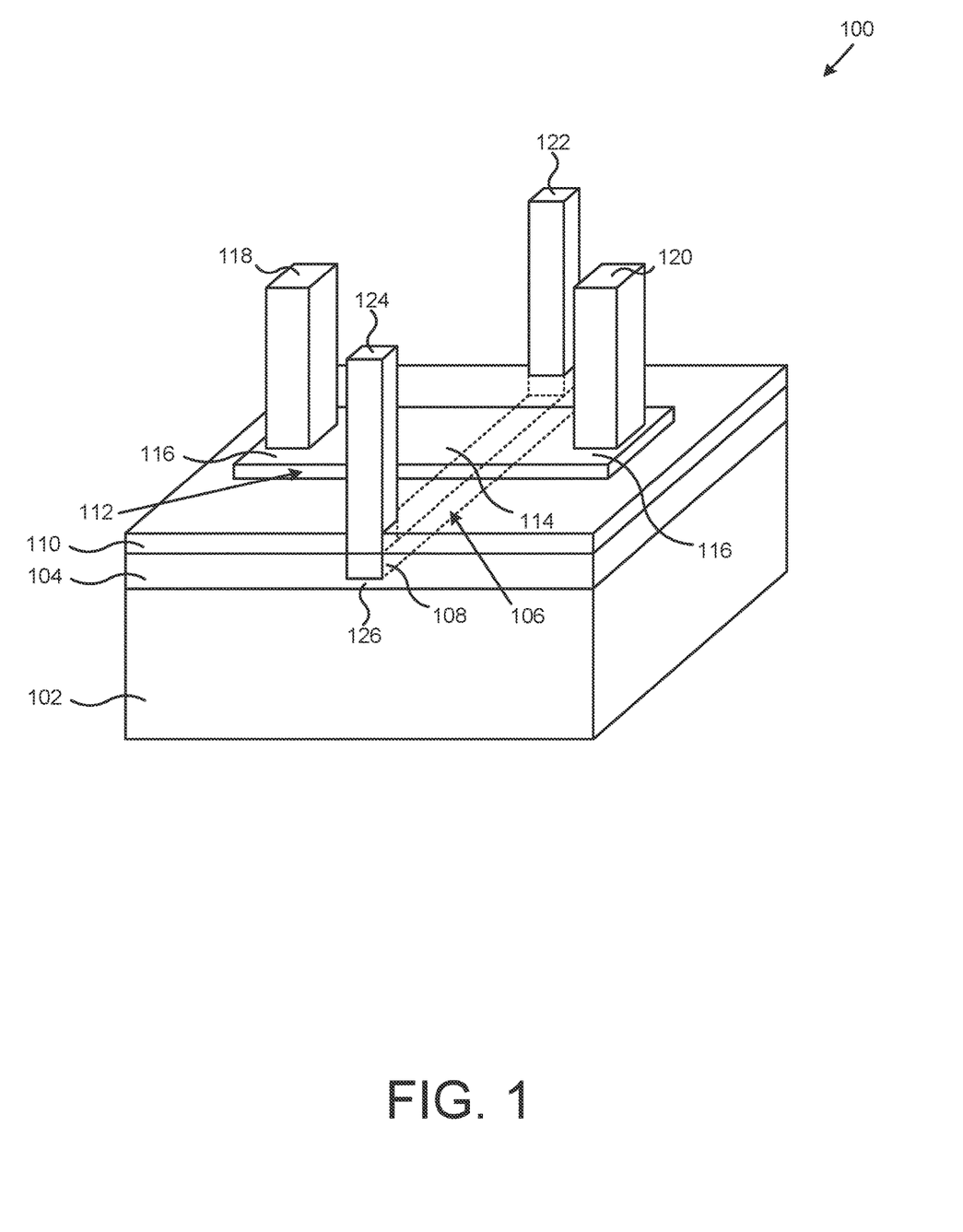
FIG. 1 illustrates a perspective view of a portion of a phase-change material (PCM) radio frequency (RF) switch according to one implementation of the present application.

FIG. 1 illustrates a perspective view of a portion of a (PCM) radio frequency (RF) according to one implementation of the present application. As shown in FIG. 1, PCM RF switch 100 includes heat spreader 102, lower dielectric 104, heating element 106 having terminal portions 108, sheet of thermally conductive and electrically insulating material 110, PCM 112 having active segment 114 and passive segments 116, PCM contacts 118 and 120, and heating element contacts 122 and 124. For purposes of illustration, the perspective view in FIG. 1 shows selected structures of PCM RF switch 100. PCM RF switch 100 may include other structures not shown in FIG. 1.

Heat spreader 102 is situated under lower dielectric 104. Heat spreader 102 generally dissipates excess heat generated by PCM RF switch 100. In particular, heat spreader 102 dissipates excess heat generated by heating element 106 after a heat pulse, such as a crystallizing pulse or an amorphizing pulse, has transformed the state of PCM RF switch 100 to an ON state or an OFF state. Heat spreader 102 can comprise any material with high thermal conductivity. In one implementation, heat spreader 102 can comprise a material with high thermal conductivity and high electrical resistivity. In various implementations, heat spreader 102 can comprise aluminum nitride (AlN), aluminum oxide (AlO), beryllium oxide (BeO), silicon carbide (SiC), diamond, diamond-like carbon, or sapphire. In one implementation, the thermal conductivity of heat spreader 102 can range from approximately thirty five watts per meter-kelvin to approximately one hundred twenty watts per meter-kelvin (35 W/(m·K)-120 W/(m·K)). In another implementation, heat spreader 102 can comprise a material with high thermal conductivity and low electrical resistivity. In various implementations, heat spreader 102 can comprise silicon (Si), germanium (Ge), silicon germanium (SiGe), silicon carbide (SiC), or group III-V material. In one implementation, the thermal conductivity of heat spreader 102 can range from approximately one hundred fifty watts per meter-kelvin to approximately three hundred seventy watts per meter-kelvin (150 W/(m·K)-370 W/(m·K)).

Lower dielectric 104 in PCM RF switch 100 is situated on top of heat spreader 102 and below sheet of thermally conductive and electrically insulating material 110. As shown in FIG. 1, lower dielectric 104 is also adjacent to sides of heating element 106. Lower dielectric 104 extends along the width of PCM RF switch 100, and is also coplanar with the top of heating element 106. Because PCM RF switch 100 includes lower dielectric 104 on the sides of heating element 106, less heat transfers horizontally (i.e., from the sides) and more heat dissipates vertically from heating element 106 toward active segment 114 of PCM 112. In various implementations, lower dielectric 104 can have a relative width and/or a relative thickness greater or less than shown in FIG. 1. Lower dielectric 104 may comprise a material with thermal conductivity lower than that of sheet of thermally conductive and electrically insulating material 110. In various implementations, lower dielectric 104 can comprise silicon oxide ($SiO_2$) silicon nitride (SiN), or another dielectric.

Heat valve 126 is situated between heating element 106 and heat spreader 102. In the present implementation, heat valve 126 is a segment of lower dielectric 104. Because PCM RF switch 100 includes heat valve 126 under heating element 106, vertical heat dissipation from heating element 106 is heavily biased toward active segment 114 of PCM 112, rather than toward heat spreader 102. Thus, active segment 114 of PCM 112 can reach higher temperatures for the same applied pulse power. In one implementation, the thickness of heat valve 126 is approximately two hundred angstroms (200 Å). In one implementation, rather than PCM RF switch 100 including heat valve 126 as a segment of lower dielectric 104, PCM RF switch 100 can include heat valve 126 distinct from lower dielectric 104. For example, PCM RF switch 100 can include a liner around heating element 106 that performs as heat valve 126. As another example, PCM RF switch 100 can include another dielectric under heating element 106. In one implementation, heat valve 126 can be omitted, and heating element 106 can be situated on heat spreader 102.

Heating element 106 in PCM RF switch 100 is situated in lower dielectric 104. Heating element 106 also underlies and approximately defines active segment 114 of PCM 112. Heating element 106 generates a crystallizing pulse or an amorphizing pulse for transforming active segment 114 of PCM 112. Heating element 106 can comprise any material capable of Joule heating. Heating element 106 can be connected to electrodes of a current source (not shown in FIG. 1) that generates a crystallizing pulse or an amorphizing pulse. Preferably, heating element 106 comprises a material that exhibits minimal electromigration or substantially no electromigration. In various implementations, heating element 106 can comprise a metal such as tungsten (W), molybdenum (Mo), titanium (Ti), titanium tungsten (TiW), titanium nitride (TiN), tantalum (Ta), nickel chromium (NiCr), or nickel chromium silicon (NiCrSi). For example, in one implementation, heating element 106 comprises tungsten lined with titanium and titanium nitride.

Sheet of thermally conductive and electrically insulating material 110 in PCM RF switch 100 is situated on top of heating element 106 and lower dielectric 104, and under PCM 112 and, in particular, under active segment 114 of PCM 112. Sheet of thermally conductive and electrically insulating material 110 ensures efficient heat transfer between heating element 106 and active segment 114 of PCM 112, while impeding electrical signals from leaking out from the path between PCM contacts 118 and 120 to heating element 106 or to other neighboring structures.

Sheet of thermally conductive and electrically insulating material 110 can comprise any material with high thermal conductivity and high electrical resistivity. In various implementations, sheet of thermally conductive and electrically insulating material 110 can comprise aluminum nitride (AlN), aluminum oxide (AlO), beryllium oxide (BeO), diamond, or diamond-like carbon. In the present implementation, sheet of thermally conductive and electrically insulating material 110 is a sheet wider than heating element 106.

PCM 112 in PCM RF switch 100 is situated on top of sheet thermally conductive and electrically insulating material 110. PCM 112 includes active segment 114 and passive segments 116. Active segment 114 of PCM 112 approximately overlies heating element 106. Passive segments 118 of PCM 112 extend outward and are transverse to heating element 106, and are situated approximately under PCM contacts 118 and 120. As used herein, "active segment" refers to a segment of PCM that transforms between crystalline and amorphous phases, for example, in response to a crystallizing or an amorphizing heat pulse, whereas "passive segment" refers to a segment of PCM that does not make such transformation and maintains a crystalline phase (i.e., maintains a conductive state).

With proper heat pulses and heat dissipation, active segment 114 of PCM 112 can transform between crystalline and amorphous phases, allowing PCM RF switch 100 to switch between ON and OFF states respectively. Active segment 114 of PCM 112 must be heated and rapidly quenched in order for PCM RF switch 100 to switch states. If active segment 114 of PCM 112 does not quench rapidly enough, it will not transform and PCM RF switch 100 will fail to switch states. How rapidly active segment 114 of PCM 112 must be quenched depends on the material, volume, and temperature of PCM 112. In one implementation, the quench time window can be approximately one hundred nanoseconds (100 ns) or greater or less.

PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from forty percent to sixty percent germanium by composition (i.e., $Ge_XTe_Y$, where $0.4 \leq X \leq 0.6$ and $Y=1-X$). The material for PCM 112 can be chosen based upon ON state resistivity, OFF state electric field breakdown voltage, crystallization temperature, melting temperature, or other considerations. It is noted that in FIG. 1, heating element 106 extends outwards and is transverse to PCM 112. Heating element 106 is illustrated with dashed lines as seen through various structures of PCM RF switch 100. Current flowing in heating element 106 flows substantially under active segment 114 of PCM 112.

PCM contacts 118 and 120 (also referred to herein as "bottom vias") in PCM RF switch 100 are connected to passive segments 116 of PCM 112. Similarly, heating element contacts 122 and 124 are connected to terminal portions 108 of heating element 106. PCM contacts 118 and 120 provide RF signals to and from PCM 112. Heating element contacts 122 and 124 provide power to heating element 106 for generating a crystallizing pulse or an amorphizing pulse. PCM contacts 118 and 120 and heating element contacts 122 and 124 can extend through various interlayer metal levels (not shown in FIG. 1). In various implementations, PCM contacts 118 and 120 and heating element contacts 122 and 124 can comprise tungsten (W), copper (Cu), or aluminum (Al).

In one implementation, in order to ensure uniform contact between PCM 112 and PCM contacts 118 and 120, PCM contacts 118 and 120 can extend through a contact uniformity support layer (not shown in FIG. 1) situated on top of PCM 112, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

PCM RF switch 100 has low insertion loss and is able to provide several advantages. First, PCM 112 in the crystalline state has low resistivity, while PCM 112 in the amorphous state has high resistivity. In various implementations, PCM 112 may have an area of approximately ten square microns (10 μm$^2$), and the OFF state resistance ($R_{OFF}$) of PCM RF switch 100 can range from approximately ten kilo-Ohms to approximately one mega-Ohm (10 kΩ-1MΩ), while the ON state resistance ($R_{ON}$) of PCM RF switch 100 can be approximately one Ohm (1Ω) or less. In contrast, a conventional switch may need a channel area of approximately four hundred square microns (400 μm$^2$) to achieve the same $R_{ON}$.

Second, where an optional contact uniformity support layer is utilized as described above, PCM 112 will remain substantially intact, and PCM contacts 118 and 120 can uniformly contact passive segments 116 of PCM 112. Because the $R_{ON}$ of PCM RF switch 100 in FIG. 1 depends heavily on the uniformity of contacts made with PCM 112, the $R_{ON}$ will be significantly lower when an optional contact uniformity support layer is used.

Third, because PCM RF switch 100 includes lower dielectric 104 adjacent to sides of heating element 106, more heat dissipates vertically from heating element 106. Lower dielectric 104 under heating element 106 also performs as a heat valve that biases vertical heat dissipation from heating element 106 toward active segment 114 of PCM 112, rather than toward heat spreader 102, enabling PCM RF switch 100 to transition between OFF and ON states using even lower power and/or even quicker pulses. Thus, passive segments 116 are subjected to less thermal cycling consequences, and can be spaced more closely to decrease $R_{ON}$, as disclosed in U.S. patent application Ser. No. 16/103,587 filed on Aug. 14, 2018, titled "Design for High Reliability RF Switch Based on Phase-Change Material." The disclosure and content of the above-identified application are incorporated fully by reference into the present application.

Fourth, PCM contacts 118 and 120 can be formed crosswise to heating element contacts 122 and 124, further reducing parasitic capacitive coupling. This reduction in parasitic capacitance values of PCM RF switch 100 is disclosed and described in U.S. patent application Ser. No. 16/161,960 filed on Oct. 16, 2018, titled "Phase-Change Material (PCM) Radio Frequency (RF) Switch with Reduced Parasitic Capacitance." The disclosure and content of the above-identified application are incorporated fully by reference into the present application.

Fifth, in addition to having low insertion loss and the other advantages described above, PCM RF switch 100 is advantageously non-volatile. That is, active segment 114 of PCM 112 maintains its crystalline (ON state) or amorphous phase (OFF state) even when power is not supplied to heating element 106. PCM RF switch 100 requires less power than conventional switches when remaining in an ON state. Also, PCM RF switch 100 is resilient to voltage fluctuations in its programming, making PCM RF switch 100 particularly applicable in antenna tuners and other circuits which might experience large voltage fluctuations.

Sixth, notably, because heat spreader 102 has high thermal conductivity, it effectively dissipates the heat generated by heating element 106. Thus, active segment 114 of PCM 112 can rapidly quench and successfully transform phases, and PCM RF switch 100 can switch states with improved reliability. Additionally, PCM 112 can utilize different materials and different dimensions that require faster quench times.

Figure 2:
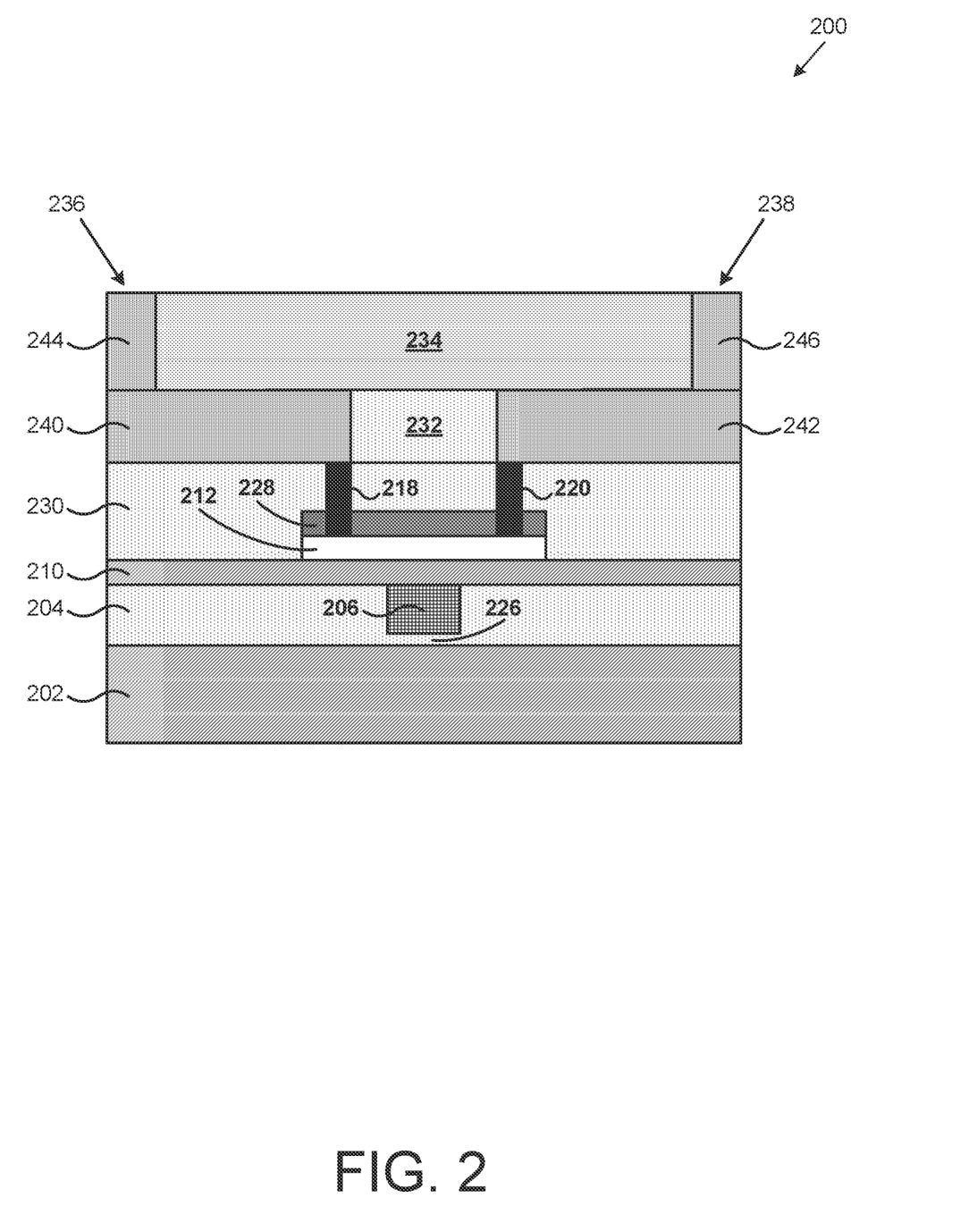
FIG. 2 illustrates a cross-sectional view of a portion of an RF device according to one implementation of the present application.

FIG. 2 illustrates a cross-sectional view of a portion of an RF device according to one implementation of the present application. In the present application, the term "RF device" refers to a structure that includes a PCM RF switch, but may also include additional structures as discussed below and as shown in the drawings. As shown in FIG. 2, RF device 200 includes heat spreader 202, lower dielectric 204, heating element 206, sheet of thermally conductive and electrically insulating material 210, PCM 212, optional contact uniformity support layer 228, contact dielectric 230, specialized metal layer 232, interlayer dielectric (ILD) 234, and input/output terminals 236 and 238. Heat spreader 202, lower dielectric 204, heating element 206, sheet of thermally conductive and electrically insulating material 210, PCM 212, and heat valve 226 in FIG. 2 generally correspond to heat spreader 102, lower dielectric 104, heating element 106, sheet of thermally conductive and electrically insulating material 110, PCM 112, and heat valve 126 in FIG. 1, and may have any implementations or advantages described above.

Optional contact uniformity support layer 228 is situated over PCM 212. In one implementation, optional contact uniformity support layer 228 comprises SiN. In another implementation, optional contact uniformity support layer 228 is a bi-layer that comprises oxide and nitride, such as $SiO_2$ under SiN. Optional contact uniformity support layer 228 can be provided, for example, by plasma enhanced CVD (PECVD) or high density plasma CVD (HDP-CVD).

Contact dielectric 230 is situated over optional contact uniformity support layer 228 and over sheet of thermally conductive and electrically insulating material 210. In various implementations, contact dielectric 230 is $SiO_2$, boron-doped $SiO_2$, phosphorous-doped $SiO_2$, SiN, or another dielectric. In various implementations, contact dielectric 230 is a low-k dielectric, such as fluorinated silicon dioxide, carbon-doped silicon oxide, or spin-on organic polymer. Contact dielectric 230 can be provided, for example, by PECVD, HDP, or spin-on processes.

Bottom vias 218 and 220 extend through contact dielectric 230 and through optional contact uniformity support layer 228 (in case optional contact uniformity support layer 228 is used), and connect to passive segments of PCM 212. Bottom vias 218 and 220 in FIG. 2 generally correspond to PCM contacts 118 and 120 in FIG. 1, and may have any implementations and advantages described above.

In the present implementation, forming bottom vias 218 and 220 may comprise two different etching actions. In the first etching action, contact dielectric 230 can be aggressively etched without having to accurately time the etching action. This etching action can use a selective etch, for example, a fluorine-based plasma dry etch, and optional contact uniformity support layer 228 can perform as an etch stop while contact dielectric 230 is selectively etched.

In the second etching action, optional contact uniformity support layer 228 is punch-through etched. As used herein, "punch-through" refers to a short etching action that can be accurately timed to stop at the top surface of PCM 212. In the present implementation, bottom vias 218 and 220 are narrow and optional contact uniformity support layer 228 is thin. Thus, only a small volume of optional contact uniformity support layer 228 is etched, and the punch-through etching action is short and can be accurately timed. In one implementation, a chlorine-based plasma dry etch is used for this etching action.

Optional contact uniformity support layer 228 is optional in that the inventive concepts of the present application may be implemented without optional contact uniformity support layer 228. For example, bottom vias 218 and 220 can extend through contact dielectric 230 into PCM 212. Because the ON state resistance ($R_{ON}$) of a PCM RF switch depends heavily on the uniformity of contact made between bottom vias 218 and 220 and PCM 212, the $R_{ON}$ can be significantly lower when optional contact uniformity support layer 228 is used.

Input/output terminals 236 and 238 are situated over PCM 212, and provide RF signals to and from PCM 212. In the present implementation, input/output terminals 236 and 238 are multi-level contacts. Input/output terminal 236 includes bottom via 218, interim metal segment 240, and top via 244. Top via 244 is coupled to interim metal segment 240, interim metal segment 240 is coupled to bottom via 218, and bottom via 218 contacts PCM 212. In particular, bottom via 218 contacts the top surface of a passive segment of PCM 212. Likewise, input/output terminal 238 includes bottom via 220, interim metal segment 242, and top via 246. Top via 246 is coupled to interim metal segment 242, interim metal segment 242 is coupled to bottom via 220, and bottom via 220 contacts PCM 212. In particular, bottom via 220 contacts the top surface of a passive segment of PCM 212.

Interim metal segments 240 and 242 of input/output terminals 236 and 238 are situated in specialized metal layer 232. As described below, "specialized metal layer" refers to a metal layer that would not be present in a conventional back-end-of-line (BEOL) multi-level metallization (MLM) scheme. Specialized metal layer 232 in situated over contact dielectric 230. Specialized metal layer 232 includes dielectric around interim metal segments 240 and 242. In various implementations, the dielectric can comprise silicon oxide (SiO), silicon nitride (SiN), silicon oxynitride (SiON), or a low-k dielectric. In various implementations, interim metal segments 240 and 242 may comprise W, Cu, and/or Al. Interim metal segments 240 and 242 may be formed by subtractive etch processes, single damascene processes, or any other suitable processes. In another implementation, these structures may be formed by dual damascene processes. For example, interim metal segments 240 and 242 and bottom vias 218 and 220 may be integrally formed from the same metal deposit using a dual damascene process such that no metal-to-metal interface exists therebetween.

Top vias 244 and 246 of input/output terminals 236 and 238 are situated in ILD 234. In various implementations, ILD 234 can comprise silicon oxide (SiO), silicon nitride (SiN), or silicon oxynitride (SiON). In various implementations, top vias 244 and 246 may comprise W, Cu, and/or Al. Top vias 244 and 246 may be formed by subtractive etch processes, single damascene processes, or any other suitable processes. In the present implementation, interim metal segments 240 and 242 and top vias 244 and 246 have an offset relative to bottom vias 218 and 220. In one implementation, Input/output terminals 236 and 238 can be part of a step-wise structure of interconnect metal segments and vias. This step-wise structure is disclosed and described in U.S. patent application Ser. No. 16/216,008 filed on Dec. 11, 2018, titled "Phase-Change Material (PCM) Radio Frequency (RF) Switch with Reduced Parasitic Capacitance." The disclosure and content of the above-identified application are incorporated fully by reference into the present application.

Figure 3A:
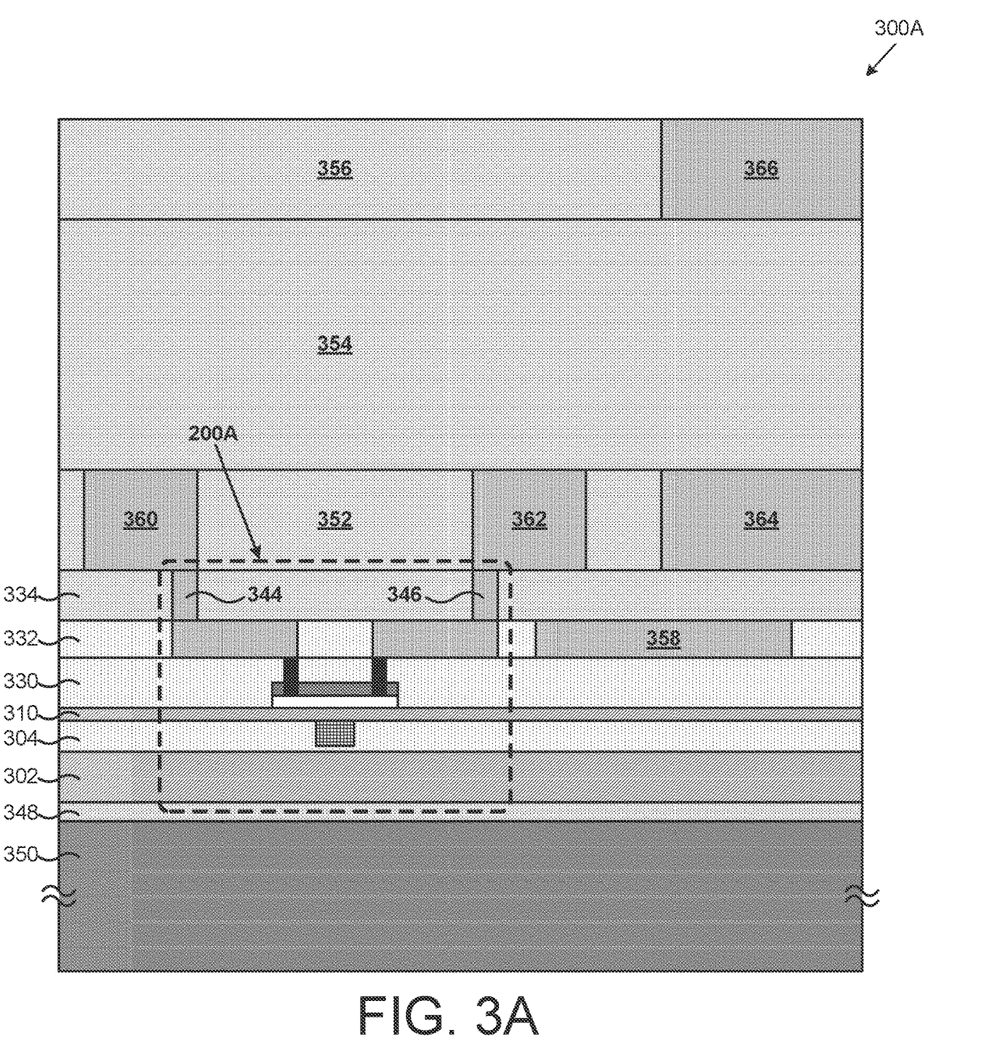
FIG. 3A illustrates a cross-sectional view of a portion of a discrete RF device according to one implementation of the present application.

FIG. 3A illustrates a cross-sectional view of a portion of a discrete RF device according to one implementation of the present application. As shown in FIG. 3A, discrete RF device 300A includes outlined structure 200A, substrate 350, optional dielectric 348, heat spreader 302, lower dielectric 304, sheet of thermally conductive and electrically insulating material 310, contact dielectric 330, specialized metal layer 332, ILDs 334 and 354, and metal interconnect layers 352 and 356. Outlined structure 200A in FIG. 3A generally corresponds to RF device 200 in FIG. 2, and may have any implementations or advantages described above. Heat spreader 302, lower dielectric 304, sheet of thermally conductive and electrically insulating material 310, contact dielectric 330, specialized metal layer 332, and ILD 334 in FIG. 3A generally correspond to heat spreader 202, lower dielectric 204, sheet of thermally conductive and electrically insulating material 210, contact dielectric 230, specialized metal layer 232, and ILD 234 in FIG. 2, and may have any implementations or advantages described above.

Substrate 350 is situated under outlined structure 200A and optional dielectric 348 (in case optional dielectric 348 is used). In particular, heat spreader 302 is situated over substrate 350. In one implementation, substrate 350 is an insulator, such as $SiO_2$. In various implementations, substrate 350 is a silicon (Si), silicon-on-insulator (SOI), sapphire, complementary metal-oxide-semiconductor (CMOS), bipolar CMOS (BiCMOS), or group III-V substrate. Substrate 350 can have additional layers (not shown in FIG. 3A). In one implementation, substrate 350 can also comprise a plurality of active devices (not shown in FIG. 3A).

In various implementations, optional dielectric 348 can comprise borophosphosilicate glass (BPSG), tetra-ethyl ortho-silicate (TEOS), silicon onynitride (SiON), silicon oxide (SiO), silicon nitride (SiN), or another dielectric. Optional dielectric 348 is optional in that the inventive concepts of the present application may be implemented without optional dielectric 348. For example, heat spreader 302 can be situated directly on substrate 350. However, when optional contact uniformity support layer 228 is used, RF noise coupling in substrate 350 from the PCM RF switch in outlined structure 200A is reduced.

Metal interconnect layer 352 is situated over ILD 334. ILD 354 is situated over metal interconnect layer 352. Metal interconnect layer 356 is situated over ILD 354. Metal interconnect layers 352 and 356 and ILD 354 represent a conventional back-end-of-line (BEOL) multi-level metallization (MLM) scheme. For example, metal interconnect layers 352 and 356 and ILD 354 can be used for routing electrical signals between various devices (not shown in FIG. 3A) that may exist independent of the PCM RF switch in outlined structure 200A, and metal interconnect layers 352 and 356 and ILD 354 can have predetermined thicknesses and spacing standardized by a manufacturer for use across multiple device designs. In the present implementation metal interconnect layers 352 and 356 are the first metal interconnect layer (i.e., M1) and second metal interconnect layer (i.e., M2) respectively. ILD 354 provides insulation between metal interconnect layers 352 and 356, and may have any implementations and advantages described above with respect to ILD 334 (or ILD 234 in FIG. 2).

As seen in FIG. 3A, upper interconnect metal segments 360 and 362 are situated in metal interconnect layer 352. Upper interconnect metal segment 360 is coupled to top via 344 in outlined structure 200A. Likewise, upper interconnect metal segment 362 is coupled to top via 346 in outlined structure 200A. Upper interconnect metal segments 360 and 362 are further parts of input/output terminals for a PCM RF switch (corresponding to input/output terminals 236 and 238 in FIG. 2). In the present implementation, upper interconnect metal segments 360 and 362 have offsets relative to lower metals, and are part of a step-wise structure, as described above.

Additional interconnect metal segment 364 is situated in metal interconnect layer 352. Additional interconnect metal segment 366 is situated in metal interconnect layer 356. Additional interconnect metal segments 364 and 366 can be used for routing electrical signals between various devices (not shown in FIG. 3A) that may exist independent of the PCM RF switch in outlined structure 200A. In various implementations, integrated passive devices can also be situated in metal interconnect layers 352 and 356.

Metal interconnect layer 352 includes dielectric around upper interconnect metal segments 360 and 362 and additional interconnect metal segment 364. Likewise, metal interconnect layer 356 includes dielectric around additional interconnect metal segment 366. In various implementations, the dielectric can comprise silicon oxide (SiO), silicon nitride (SiN), or silicon oxynitride (SiON). In various implementations, upper interconnect metal segments 360 and 362 and additional interconnect metal segments 364 and 366 may comprise W, Cu, and/or Al. Upper interconnect metal segments 360 and 362 and additional interconnect metal segments 364 and 366 may be formed by subtractive etch processes, single damascene processes, or any other suitable processes. In another implementation, these structures may be formed by dual damascene processes. For example, upper interconnect metal segments 360 and 362 and top vias 344 and 346 may be integrally formed from the same metal deposit using a dual damascene process such that no metal-to-metal interface exists therebetween.

In various implementations, discrete RF device 300A can include more metal interconnect layers and/or more ILDs, and more vias and/or interconnect metal segments, than those shown in FIG. 3A. Vias and interconnect metal segments can also electrically connect to other structures (not shown in FIG. 3A), such as passive devices built in various metallization levels. Also, it is noted that top vias 344 and 346 and interconnect metal segments 360 and 362 connected to the PCM in outlined structure 200A (i.e., connected to PCM 112 in FIG. 1) may be situated on a different plane relative to vias connected to the heating element in outlined structure 200A (i.e., connected to heating element 106 in FIG. 1).

Outlined structure 200A, and in particular specialized metal layer 332, represents a departure from a conventional BEOL MLM scheme. As used herein, "specialized metal layer" refers to a metal layer that would not be present in a conventional BEOL MLM scheme. For example, specialized metal layer 332 is situated between contact dielectric 330 which includes PCM and metal interconnect layer 352, and specialized metal layer 332 and contact dielectric 330 together occupy a region that may otherwise be occupied by ILD 334. In this manner, specialized metal layer 332 is different from a conventional metal interconnect layer in that specialized metal layer 332 is situated on top of a layer which includes PCM, rather than on top of a layer which only includes metal and/or substrate devices. In one implementation, specialized metal layer 332 can be substantially thinner than metal interconnect layers 352 and 356.

As described above, specialized metal layer 332 in FIG. 3A includes interim metal segments of input/output terminals (corresponding to interim metal segments 240 and 242 of input/output terminals 236 and 238 in FIG. 2). Specialized metal layer 332 can also include additional interim metal segment 358. Additional interim metal segment 358 can be used for routing electrical signals between various devices (not shown in FIG. 3A) other than, or in addition to, the PCM RF switch in outlined structure 200A. Additional interim metal segment 358 can also be used for formation of integrated passive devices in specialized metal layer 332. In various implementations, discrete RF device 300A can include more additional interim metal segments than those shown in FIG. 3A.

Notably, in the present implementation, heat spreader 302 is unpatterned, and extends substantially across the width of discrete RF device 300A. In various implementations, heat spreader can be unpatterned, while minor details such as dicing imperfections or protective packaging along the sides of the device may prevent heat spreader 302 extending across the entire width. Also, sheet of thermally conductive and electrically insulating material 310 is substantially unpatterned, except for patterning (not visible in the cross-sectional view of FIG. 3A) to allow connection of heating element contacts (corresponding to heating element contacts 122 and 124 in FIG. 1) to the heating element in outlined structure 200A. The unpatterned heat spreader 302 and substantially unpatterned sheet of thermally conductive and electrically insulating material 310 can improve thermal performance of the PCM RF switch, but can trade off routing versatility. For example, metals coupled to devices in substrate 350 (not shown in FIG. 3A) may route more easily from the back of substrate 350 than through unpatterned heat spreader 302 and substantially unpatterned sheet of thermally conductive and electrically insulating material 310.

In one implementation of a discrete RF device according to the present application, all metal interconnect layer(s) in the device are situated over the PCM. For example, in discrete RF device 300A, metal interconnect layers 352 and 356 are situated over the PCM in outlined structure 200A. Advantageously, in discrete RF device 300A, because metal interconnect layers are situated over the PCM, heat spreader 302, lower dielectric 304, and/or sheet of thermally conductive and electrically insulating material 310 can comprise thermally grown materials rather than deposited materials, since prior to formation of metal interconnect layers high temperature processes can be used.

Figure 3B:
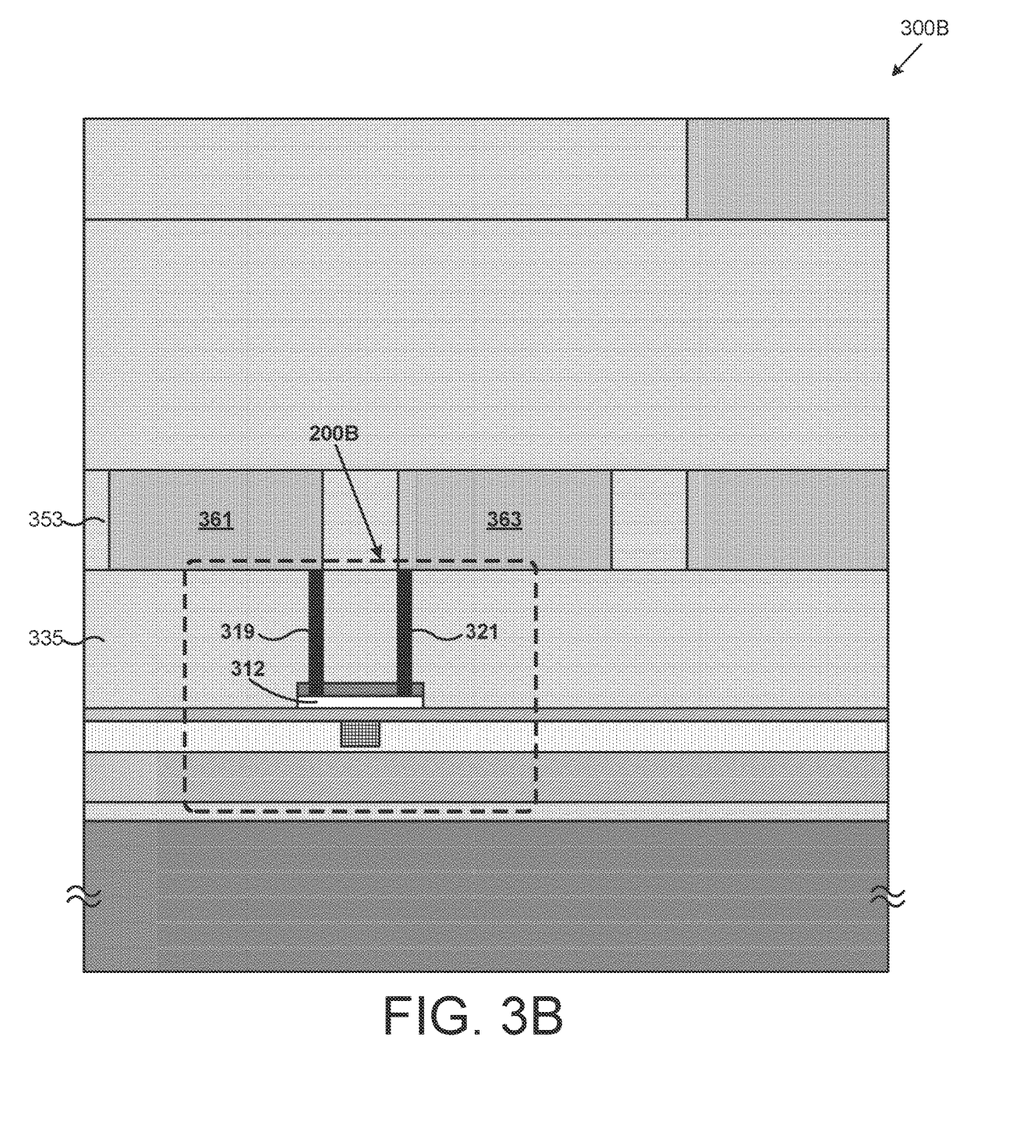
FIG. 3B illustrates a cross-sectional view of a portion of a discrete RF device according to one implementation of the present application.

FIG. 3B illustrates a cross-sectional view of a portion of a discrete RF device according to one implementation of the present application. Except for differences noted below, discrete RF device 300B in FIG. 3B generally corresponds to discrete RF device 300A in FIG. 3A, and may have any implementations and advantages described above. In FIG. 3A, the input/output terminals comprised a multi-level contact where bottom vias, interim metal segments, and top vias extend through contact dielectric 330, specialized metal layer 332, and ILD 334 respectively to couple to upper interconnect metal segments 360 and 362 situated in metal interconnect layer 352. In contrast, in FIG. 3B, the input/output terminals comprise a single-level contact where direct vias 319 and 321 contacting PCM 312 extend through ILD 335 to couple to upper interconnect metal segments 361 and 363 situated in metal interconnect layer 353. Thus, outlined structure 200B in FIG. 3B generally corresponds to an alternative to outlined structure 200A in FIG. 3A where contact dielectric 330 and specialized metal layer 332 are omitted. Discrete RF device 300B in FIG. 3B may simplify manufacturing.

Figure 4A:
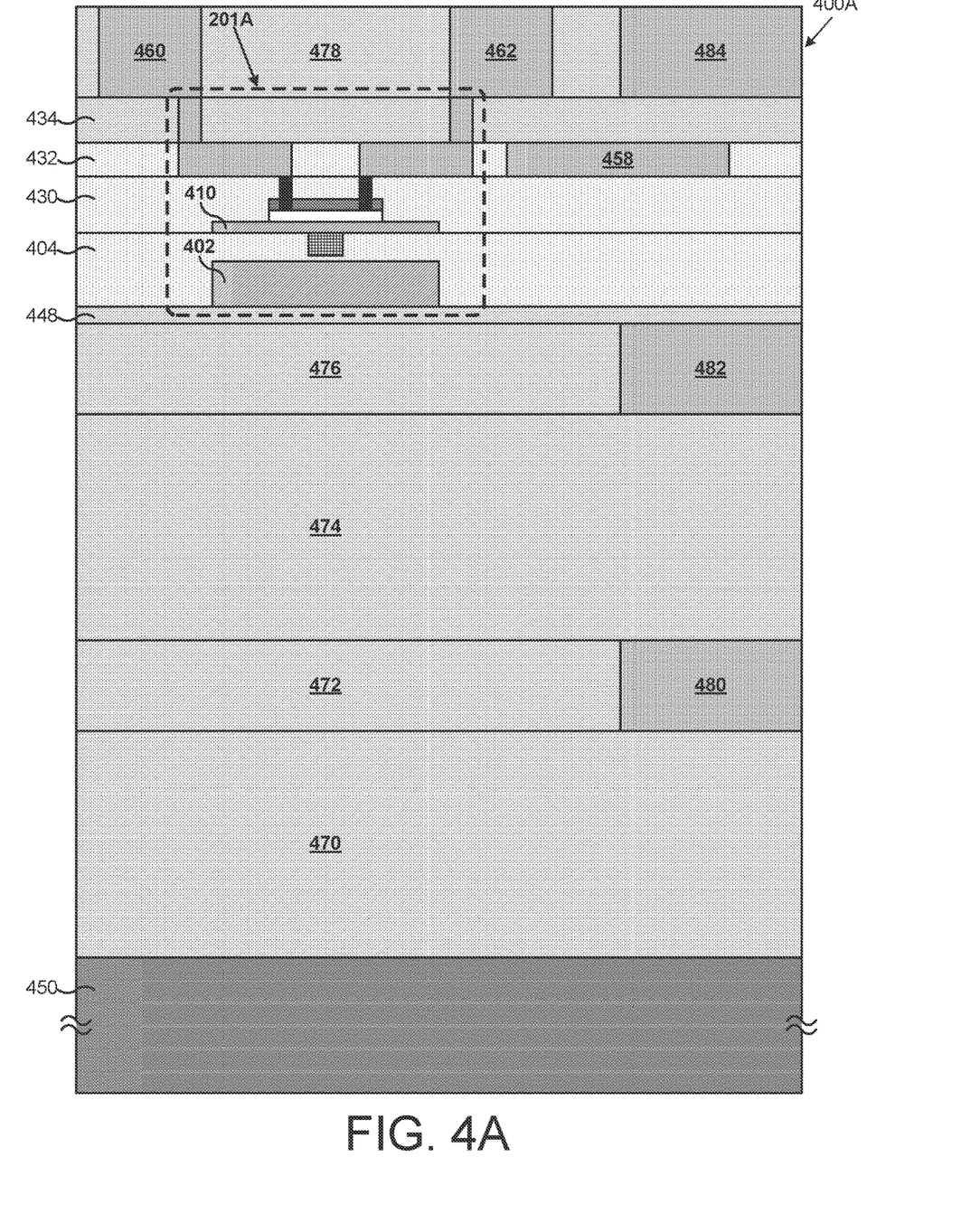
FIG. 4A illustrates a cross-sectional view of a portion of a monolithic RF device according to one implementation of the present application.

FIG. 4A illustrates a cross-sectional view of a portion of a monolithic RF device according to one implementation of the present application. As shown in FIG. 4A, monolithic RF device 400A includes outlined structure 201A, substrate 450, ILDs 434, 470, and 474, metal interconnect layers 472, 476, and 478, optional dielectric 448, heat spreader 402, lower dielectric 404, sheet of thermally conductive and electrically insulating material 410, contact dielectric 430, and specialized metal layer 432. Except for differences noted below, outlined structure 201A, substrate 450, ILD 434, optional dielectric 448, heat spreader 402, lower dielectric 404, sheet of thermally conductive and electrically insulating material 410, contact dielectric 430, and specialized metal layer 432 in FIG. 4A generally correspond to outlined structure 200A, substrate 350, ILD 334, optional dielectric 348, heat spreader 302, lower dielectric 304, sheet of thermally conductive and electrically insulating material 310, contact dielectric 330, and specialized metal layer 332 in FIG. 3A, and may have any implementations or advantages described above.

In FIG. 4A, heat spreader 402 and sheet of thermally conductive and electrically insulating material 410 are patterned, and do not extend substantially across the width of monolithic RF device 400A. In the present implementation, heat spreader 402 and sheet of thermally conductive and electrically insulating material 410 are substantially coextensive with each other, wider than the PCM in contact dielectric 430, and narrower than the interim metal segments in specialized metal layer 432. In various implementations, heat spreader 402 and sheet of thermally conductive and electrically insulating material 410 can each be wider or narrower than shown in FIG. 4A, and can have different widths relative to each other, the PCM, and/or the interim metal segments. Sheet of thermally conductive and electrically insulating material 110 can remain wider than the heating element in lower dielectric 404.

Lower dielectric 404 and contact dielectric 430 fill the missing patterned parts of heat spreader 402 and sheet of thermally conductive and electrically insulating material 410 respectively. As a result, lower dielectric 404 and contact dielectric 430 in FIG. 4A are thicker compared to lower dielectric 304 and contact dielectric 330 in FIG. 3A. In various implementations, dielectrics distinct from lower dielectric 404 and contact dielectric 430 can fill the missing patterned parts of heat spreader 402 and sheet of thermally conductive and electrically insulating material 410.

The patterned heat spreader 402 and patterned sheet of thermally conductive and electrically insulating material 410 can improve versatility. For example, since heat spreader 402 and sheet of thermally conductive and electrically insulating material 410 are patterned, metals above the PCM can route more easily to metals below the PCM. In one implementation of a monolithic RF device according to the present application, the metal interconnect layer(s) in the device might be situated under and/or over the PCM.

As an example, in monolithic RF device 400A, outlined structure 201A and optional dielectric 448 (in case optional dielectric 448 is used) are situated between the second metal interconnect layer 476 and the third metal interconnect layer 478 (i.e., between M2 and M3). As a result, specialized metal layer 432 is situated between two consecutive metal interconnect layers 476 and 478. In various implementations, outlined structure 201A and optional dielectric 448 (in case optional dielectric 448 is used) may be situated between the first metal interconnect layer 472 and the second metal interconnect layer 476 (i.e., between M1 and M2), or between substrate 450 and the first metal interconnect layer 472.

Upper interconnect metal segments 460 and 462 of the input/output terminals situated in metal interconnect layer 478 in FIG. 4A may have any implementations and advantages described above with respect to upper interconnect metal segments 360 and 362 in FIG. 3A. Additional interconnect metal segments 480, 482, and 484 situated in metal interconnect layers 472, 476, and 478 respectively in FIG. 4A may have any implementations and advantages described above with respect to additional interconnect metal segments 364 and 366 in FIG. 3A. Additional interim metal segment 458 situated in specialized metal layer 432 in FIG. 4A may have any implementations and advantages described above with respect to additional interim metal segment 358 in FIG. 3A. ILD 470 providing insulation between substrate 350 and metal interconnect layer 472, and ILD 474 providing insulation between metal interconnect layer 472 and metal interconnect layer 476, in FIG. 4A may have any implementations and advantages described above with respect to ILD 354 in FIG. 3A.

Figure 4B:
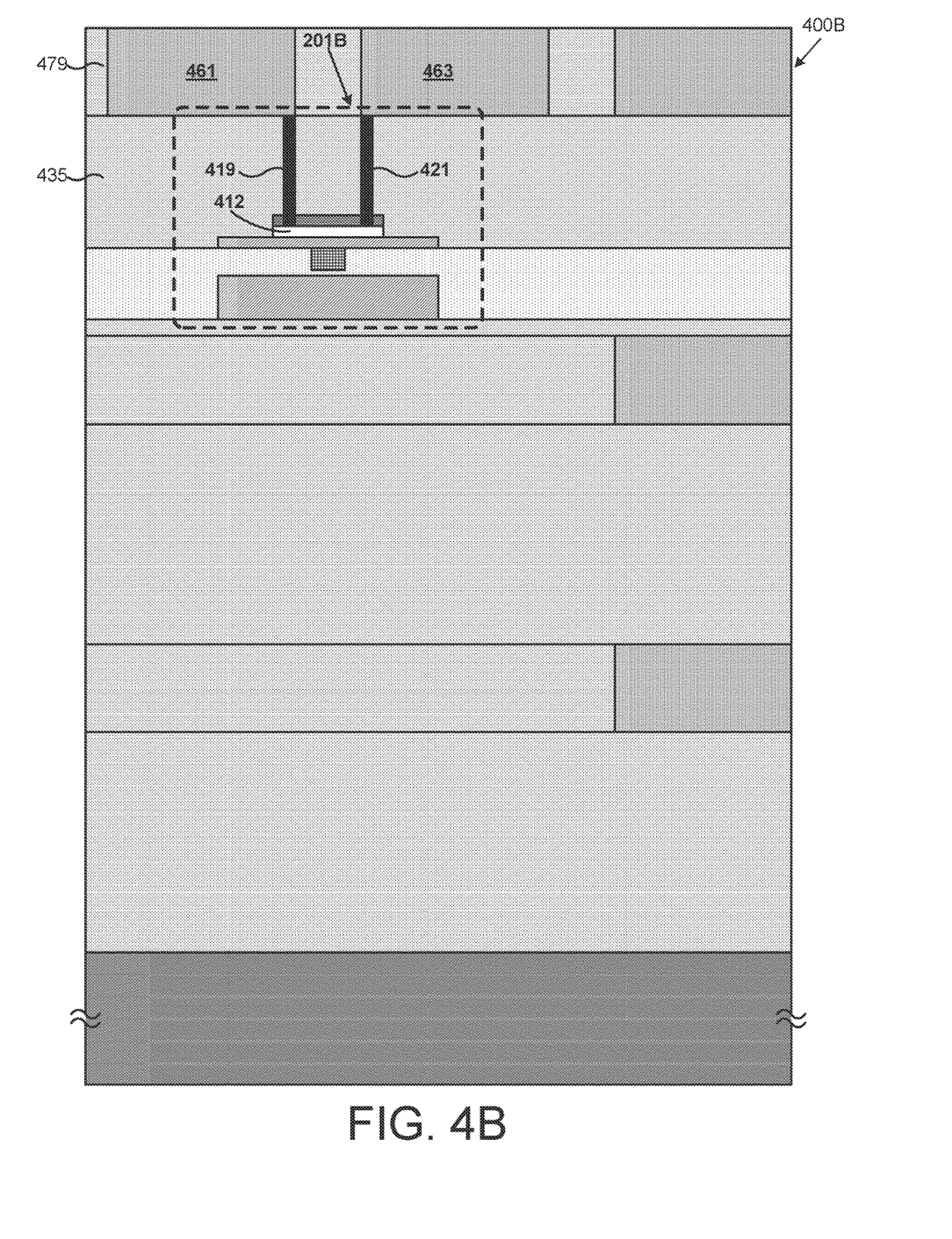
FIG. 4B illustrates a cross-sectional view of a portion of a monolithic RF device according to one implementation of the present application.

FIG. 4B illustrates a cross-sectional view of a portion of a monolithic RF device according to one implementation of the present application. Except for differences noted below, monolithic RF device 400B in FIG. 4B generally corresponds to monolithic RF device 400A in FIG. 4A, and may have any implementations and advantages described above. In FIG. 4A, the input/output terminals comprised a multi-level contact where bottom vias, interim metal segments, and top vias extend through contact dielectric 430, specialized metal layer 432, and ILD 434 respectively to couple to upper interconnect metal segments 460 and 462 situated in metal interconnect layer 478. In contrast, in FIG. 4B, the input/output terminals comprise a single-level contact where direct vias 419 and 421 contacting PCM 412 extend through ILD 435 to couple to upper interconnect metal segments 461 and 463 situated in metal interconnect layer 479. Thus, outlined structure 201B in FIG. 4B generally corresponds to an alternative to outlined structure 201A in FIG. 4A where contact dielectric 430 and specialized metal layer 432 are omitted. Monolithic RF device 400B in FIG. 4B may simplify manufacturing.

Thus, various implementations of the present application achieve RF devices with improved heat dissipation for PCM RF switches and reduced RF noise coupling for interconnect metallizations and integrated devices that overcome the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. For example, one of heat spreader 402 and sheet of thermally conductive and electrically insulating material 410 may be patterned while the other remains unpatterned or substantially unpatterned. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) device comprising:
   a phase-change material (PCM) situated over a sheet of thermally conductive and electrically insulating material;
   a heating element situated under said sheet of thermally conductive and electrically insulating material;
   an input/output terminal situated over said PCM;
   said heating element being situated in a dielectric;
   a heat spreader situated under said dielectric;
   said heat spreader being situated over a substrate; and
   a heat valve between said heating element and said heat spreader.

2. The RF device of claim 1, wherein said sheet of thermally conductive and electrically insulating material is patterned;
   said heat spreader is patterned; and
   said heat spreader is substantially co-extensive with said sheet of thermally conductive and electrically insulating material.

3. The RF device of claim 1, wherein said input/output terminal comprises a multi-level contact that includes a top via coupled to an interim metal segment, said interim metal segment being coupled to a bottom via, said bottom via contacting said PCM.

4. The RF device of claim 3, wherein said top via of said multi-level contact is coupled to an upper interconnect metal segment.

5. The RF device of claim 1, wherein said input/output terminal comprises a single-level contact that includes a direct via contacting said PCM.

6. The RF device of claim 5, wherein said direct via is coupled to an upper interconnect metal segment.

7. The RF device of claim 1, wherein said thermally conductive and electrically insulating material is selected from the group consisting of aluminum nitride (AlN), aluminum oxide (AlO), beryllium oxide (BeO), diamond, and diamond-like carbon.

8. The RF device of claim 1, wherein said heat spreader is selected from the group consisting of aluminum nitride (AlN), aluminum oxide (AlO), beryllium oxide (BeO), diamond, diamond-like carbon, sapphire, silicon (Si), germanium (Ge), silicon germanium (SiGe), silicon carbide (SiC), and group III-V material.

9. The RF device of claim 1, wherein said phase-change material comprises a material selected from the group consisting of germanium telluride ($Ge_X Te_Y$), germanium antimony telluride ($Ge_X Sb_Y Te_Z$), germanium selenide ($Ge_X Se_Y$), and any other chalcogenide.

10. A monolithic radio frequency (RF) device comprising:
    a phase-change material (PCM) situated over a sheet of thermally conductive and electrically insulating material;
    a heating element situated under said sheet of thermally conductive and electrically insulating material;
    an input/output terminal situated over said PCM;
    said heating element being situated in a dielectric;
    a heat spreader situated under said dielectric;
    said sheet of thermally conductive and electrically insulating material being patterned;
    said heat spreader being patterned;
    a plurality of metal interconnect layers, including a first metal interconnect layer situated under said PCM and a second metal interconnect layer situated over said PCM; and
    a substrate situated below said plurality of metal interconnect layers and below said heat spreader.

11. The monolithic RF device of claim 10, wherein said input/output terminal comprises a multi-level contact that includes a top via coupled to an interim metal segment, said interim metal segment being coupled to a bottom via, said bottom via contacting said PCM.

12. The monolithic RF device of claim 11, wherein said interim metal segment is situated in a specialized metal layer that is between two consecutive metal layers in said plurality of metal interconnect layers.

13. The monolithic RF device of claim 11, wherein said top via of said multi-level contact is further coupled to an upper interconnect metal segment, said upper interconnect metal segment being situated in one of said plurality of metal interconnect layers.

14. The monolithic RF device of claim 10, further comprising a heat valve between said heating element and said heat spreader.

15. The monolithic RF device of claim 14, wherein said direct via is coupled to an upper interconnect metal segment, said upper interconnect metal segment being situated in one of said plurality of metal interconnect layers.

16. A discrete radio frequency (RF) device comprising:
    a phase-change material (PCM) situated over a sheet of thermally conductive and electrically insulating material;
    a heating element situated under said sheet of thermally conductive and electrically insulating material;
    an input/output terminal situated over said PCM;
    said heating element being situated in a dielectric;
    a heat spreader situated under said dielectric;
    a metal interconnect layer situated over said PCM;
    a substrate situated below said metal interconnect layer and below said heat spreader; and
    a heat valve between said heating element and said heat spreader.

17. The discrete RF device of claim 16, wherein said input/output terminal comprises a multi-level contact that includes a top via coupled to an interim metal segment, said interim metal segment being coupled to a bottom via, said bottom via contacting said PCM.

18. The discrete RF device of claim 17, wherein said interim metal segment is situated in a specialized metal layer.

19. The discrete RF device of claim 16, wherein said input/output terminal comprises a single-level contact that includes a direct via contacting said PCM.

20. The discrete RF device of claim 16, wherein said thermally conductive and electrically insulating material is selected from the group consisting of aluminum nitride (AlN), aluminum oxide (AlO), beryllium oxide (BeO), diamond, and diamond-like carbon.

\* \* \* \* \*